United States Patent

Jenovelis et al.

Patent Number: 6,074,991
Date of Patent: *Jun. 13, 2000

[54] PROCESS FOR PRODUCING AN ELONGATED SUPERCONDUCTOR WITH A BISMUTH PHASE HAVING A HIGH TRANSITION TEMPERATURE AND A SUPERCONDUCTOR PRODUCED ACCORDING TO THIS PROCESS

[75] Inventors: Alexander Jenovelis, Spardorf; Manfred Wilhelm; Helmut Helldörfer, both of Nürnberg; Bernhard Roas, Erlangen, all of Germany

[73] Assignee: Siemens Aktiengesellschaft, München, Germany

[ * ] Notice: This patent issued on a continued prosecution application filed under 37 CFR 1.53(d), and is subject to the twenty year patent term provisions of 35 U.S.C. 154(a)(2).

[21] Appl. No.: 08/849,896
[22] PCT Filed: Dec. 15, 1995
[86] PCT No.: PCT/DE95/01798
 § 371 Date: Jun. 19, 1997
 § 102(e) Date: Jun. 19, 1997
[87] PCT Pub. No.: WO96/19417
 PCT Pub. Date: Jun. 27, 1996

[30] Foreign Application Priority Data

Dec. 20, 1994 [DE] Germany .............................. 44 45 405

[51] Int. Cl.[7] .............................. H01L 39/24; H01B 12/00
[52] U.S. Cl. .......................... 505/501; 505/230; 505/231; 505/236; 505/430; 505/431; 29/599; 428/688; 428/702; 428/930
[58] Field of Search .................................... 428/688, 702, 428/930; 505/501, 433, 430, 431, 230, 231, 236, 432, 450, 704; 174/125.1; 29/599

[56] References Cited

U.S. PATENT DOCUMENTS 5,661,114 8/1997 Otto et al. .............................. 505/501

FOREIGN PATENT DOCUMENTS 1 257 436 12/1967 Germany .
43 08 681 A1 9/1993 Germany ...................... C04B 35/50
WO 93/22799 11/1993 WIPO .

OTHER PUBLICATIONS

Liu, H. et al., "Microstructure and defects in Ag–clad Bi–Pb–Sr–Ca–Cu–O wires prepared through a controlled melt process," Supercond. Sci. Technol., 5, Oct. 1992, pp. 591–598.

Wilhelm, M. et al., "Fabrication and Properties of Multifilamentary BiPbSrCaCuO–2223 Tapes," Proceedings ISS '93 Hiroshima, Oct. 26–29, 1993.

Database WPI Week 9240, Derwent Publ. Ltd., London, GB; AN–92–327129 & JP–A–04 233 109 (Mitsubishi Cable, Ind. Ltd.), Aug. 1992.

(List continued on next page.)

*Primary Examiner*—Marie Yamnitzky
*Assistant Examiner*—Hong J. Xu
*Attorney, Agent, or Firm*—Kenyon & Kenyon

[57] ABSTRACT

Process for producing an elongated superconductor with a bismuth phase having a high transition temperature and a superconductor produced according to this process. An elongated superconductor with at least one conductor core made of high-$T_c$ Bi-containing superconductor material with the 2212 or 2223 phase is to be manufactured. For this purpose, the cross section of a structure made of Ag matrix material and a precursor of the superconductor material is reduced. Subsequently the raw conductor thus obtained is annealed in an oxygen-containing atmosphere. According to this invention, a temperature variation between a higher temperature (T1) and a lower temperature (T2) is provided for the annealing. The higher temperature (T1) is at most 7 K above the decomposition temperature (Tz), and the lower temperature (T2) is at most 9 K below the decomposition temperature (Tz).

13 Claims, 2 Drawing Sheets

OTHER PUBLICATIONS

Database WPI Week 9413, Derwent Publ. Ltd., London, GB; AN–94–106540 & JP–A–06 056 426 (Sumitomo Metal Ind. Ltd.), Mar. 1994.

Database WPI Week 9225, Derwent Publ. Ltd., London, GB; An–92–203497 & JP–A–04 132 111 (Mitsubishi Cable Ind. Ltd.), May 1992.

Y. Yamada et al., "Microstructural study of Bi(2223)/Ag tapes with $J_c$(77K,OT) values of up to $3.3 \times 10^4$ A $cm^{-2}$", Supercond.Sci.Technol. 4(1991) 165–171.

PROCESS FOR PRODUCING AN ELONGATED SUPERCONDUCTOR WITH A BISMUTH PHASE HAVING A HIGH TRANSITION TEMPERATURE AND A SUPERCONDUCTOR PRODUCED ACCORDING TO THIS PROCESS

DESCRIPTION

Process for producing an elongated superconductor with a bismuth phase having a high transition temperature and a superconductor produced according to this process.

BACKGROUND OF THE INVENTION

The invention concerns a process for producing an elongated single- or multi-core superconductor having at least one conductor core embedded in an Ag matrix, which conductor core has a bismuth-containing superconductor material with a 2212 or 2223 type high-$T_c$ phase. The process comprises the following steps:

A structure is prepared from the matrix material and at least one core, made of the precursor of the superconductor material, the structure is converted to a raw conductor using a special cross-section-reducing treatment, and the raw conductor is subjected to an annealing process with controlled melting in an oxygen-containing atmosphere to form the high-$T_c$ phase.

The invention also concerns a superconductor manufactured by this process.

A similar process and a superconductor produced by this process are known from "Supercond. Sci. Technol.," Vol. 5, 1992, pp. 591–598.

Known superconducting metal oxide compounds with high transition temperatures $T_c$ of over 77 K, which are therefore also referred to as high-$T_c$ superconductor materials (for short: HTSL materials), include in particular cuprate based on bismuth material Bi—Sr—Ca—Cu—O (BSCCO) or B(Pb)—Sr—Ca—Cu—O (B(P)SCCO) system. In this system, two superconducting phases appear, which differ by the number of copper-oxygen lattice planes (layers) of the crystal unit cell. A superconducting phase with the approximate composition $Bi_2Sr_2CaCu_2O_{8+y}$, (referred to as a 2-layer/85-K or 2212-phase) has a transition temperature $T_c$ of approximately 85 K, while the transition temperature of a superconducting phase with the approximate composition $Bi_2Sr_2Ca_2Cu_3O_{10+x}$, (referred to as a 3-layer or 100-K or 2223 phase) is approximately 110 K.

Attempts have been made to manufacture elongated superconductors in wire or tape form with these HTSL materials. A process considered suitable for this purpose is referred to as "powder-in-tube" technology, known in principle from the manufacture of superconductors with the traditional superconducting material $Nb_3Sn$ (see, for example, German Auslegeschrift 1 257 436). According to this method, a powder made from a precursor of the HTSL material, which in general contains little or none of the desired superconducting high-$T_c$ phase, is filled into a tubular carrier or into a matrix made of normally conducting material, in particular of Ag or an Ag alloy. The structure thus obtained is then brought to its final dimensions by means of forming processes, which may be interrupted by at least one heat treatment. Then the wire- or tape-shaped raw conductor is subjected to at least one annealing operation, performed at least partially in an oxygen-containing atmosphere, e.g., air, to adjust or optimize its superconducting characteristics or to form the desired high-$T_c$ phase (see, for example, "Supercond. Sci. Technol.," Vol. 4, 1991, pp. 165–171).

If a plurality of such tape- or wire-shaped high-$T_c$ superconductors or their conductor precursors are bundled together, conductors with a plurality of superconducting cores, referred to as multi-core or multi-filament conductors, can be obtained, which offer a series of advantages for technical applications (see the article by M. Wilhelm et al. entitled "Fabrication and Properties of Multifilamentary BiPbSrCaCuO-2223 Tapes" of the "International Symposium on Superconductivity" (ISS'93), Hiroshima, Japan, Oct. 26–29, 1993).

It is known from the aforementioned reference from "Supercond. Sci. Technol.," Vol. 5 that the textural properties of such reaction-annealed tape conductor cores can be improved, thereby increasing the critical currents, and the dependence of the critical current densities on the magnetic field can be reduced by partial melting and subsequent controlled crystallization of the ceramic. The corresponding process is known as the PFDR (phase formation-decomposition-recovery) process. According to this process, a nitrate mixture of suitable composition is calcined at 830° C. and, after reaction annealing at 845° C. in air, it yields basically the 2-layer compound and alkaline earth cuprate. With this reaction product, a tape-shaped raw conductor is prepared with a silver shell according to the powder-in-tube process and annealed at 835° to 838° C. to form the 3-layer phase. A one-time short melting of the conductor core at 860° C. between the reaction annealing and a first secondary annealing results in a higher core density and a fine distribution of 2-layer residues and intergranular minority phases in a 3-layer matrix. Thus "pinning centers" are obtained and increased magnetic field-independence of the superconductance at 77 K is ensured. Additional compacting and annealing at 838° C. is performed after the first secondary annealing at 838° C.

A similar process with a PFDR process is also disclosed in WO 93/22799. In this known process, the 2223 phase obtained in the conductor structure is also briefly melted at approximately 860° C. and post-annealed at approximately 839° C. to thus obtain a small proportion of the 2212 phase dispersed in the 2223 phase, which serves as a matrix.

Superconductor manufacturing on an industrial scale according to the PFDR process presents problems, however, because the adjustment of the optimum degree of partial melting is extremely critical. The proper volume of melted material is, however, decisive for obtaining a conductor with high core density and a high current capacity. For a given composition of the core ceramic, the melted volume depends on the temperature and the annealing time, but also on the conductor dimensions. The greater the core volume, the lower the melting temperature must be. Low-viscosity melt, which is required for quick and homogeneous material distribution and thus pore-and contaminant-free growth, is produced in sufficient amounts only in a temperature range where the superconducting phases in the B(P)SCCO superconductor decompose again. If a relatively high melting temperature (860° C.) is provided, as in the case of the known PFDR process, there is the danger that the decomposition of the desired superconducting phase can no longer be reversed by subsequent annealing at a relatively lower temperature level.

SUMMARY OF THE INVENTION

The object of this invention is therefore to provide a process that would at least alleviate the aforementioned problems, in particular regarding the danger of decomposition of the superconducting phases.

This object is achieved according to this invention by providing at least one annealing operation with a temperature that periodically fluctuates between a first, higher, temperature level and a second, lower, temperature level, with the first temperature level being at most 7° C. over the decomposition temperature of the high-$T_c$ phase to be formed and the second temperature level being at most 9° C. below said decomposition temperature. The decomposition temperature can be determined accurately by observing the first appearance of a $Bi_2Sr_2CuO_x$-type (also known as single-layer) phase in the core material.

As in the case of the known PFDR process, the process of this invention allows conductors with a relatively high core ceramic density to be manufactured. In addition, it has been observed that the conductors annealed with periodically fluctuating temperature, rather than isothermally, have a relatively higher critical current density at the same time as a high density. The desired superconducting Bi phase must therefore be at least largely present in the final product. In addition, the overheating temperature in the process according to this invention is advantageously lower and can be set accurately and reproducibly.

Advantageous embodiments of the process according to this invention are described in the dependent claims.

BRIEF DESCRIPTION OF THE DRAWINGS

The present invention will be understood and appreciated more fully from the following detailed description taken in conjunction with the drawings in which.

DETAILED DESCRIPTION OF THE INVENTION

Figure 1:
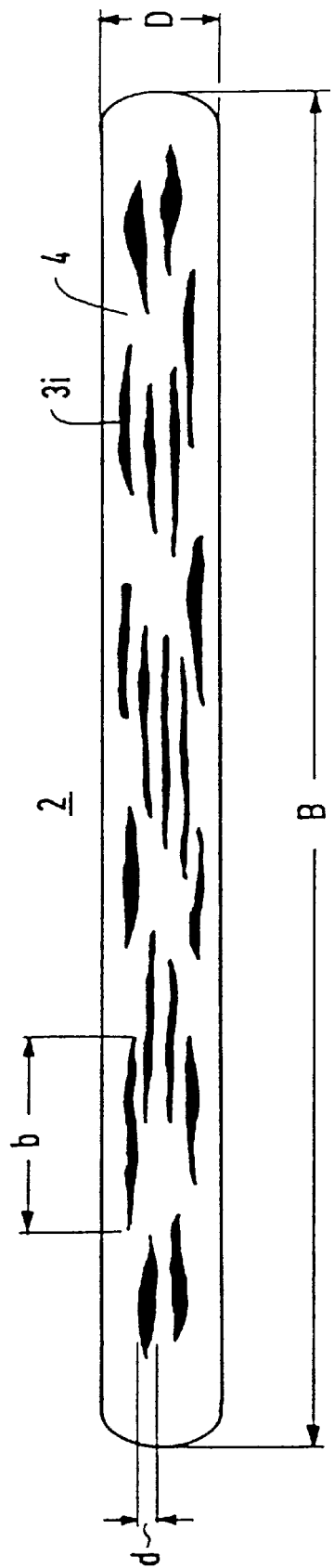
FIG. 1 is a schematic illustration of a cross section through a raw conductor to be annealed according to the present invention.

The process according to this invention for manufacturing an elongated superconductor with bismuth (Bi) high-$T_c$ superconductor material is based on the powder-in-tube process, which is known per se. Elongated composite bodies, such as wires and tapes, containing HTSL material based on the Bi—Sr—Ca—Cu—O material system, can be produced with the process. The phase known as the 2223 phase should preferably be present in the HTSL material in a proportion higher than 50 wt. %. It is possible to use only the five above-named elements of the material system to produce such HTSL material. Since the material system selected for this invention only needs to constitute the basis of the HTSL material, i.e., represents the basic type, the process according to this invention should also include the possible full or partial replacement, in a well-known manner, of some of the aforementioned elements with other elements from the same element group of the periodic system. Thus, for example, Bi can be partially replaced with Sb or by Pb, which particularly favors the formation of the 2223 phase; Ba may be considered, for example, to replace the alkaline earth metals Sr and Ca. Furthermore, Cu can be partially substituted by smaller amounts of other metals, such as Fe, Co, Ni, or Al. In addition, it should be possible to introduce additives, serving to improve the reaction mechanism, in the material system. Thus, for example, it is known that Ag or $Ag_2O$ additions actively participate in the reaction of formation of the desired high-$T_c$ phase, but are not incorporated in the crystal structure of this phase. However, we shall consider an HTSL material containing six components, Bi, Pb, Sr, Ca, Cu, and O, for the embodiment, with unavoidable impurities of the individual components necessarily included.

To manufacture an HTSL material precursor in a powder form, the well-known initial materials will be used, which make the formation of the 110 K or 2223 phase possible. In order to ensure the proper stoichiometry of this high-$T_c$ phase, oxide and/or carbonate powders of the individual components of the Bi—Pb—Sr—Ca—Cu—O material system, for example, $Bi_2O_3$, PbO, $SrCO_3$, CaO, and CuO powder, are prepared in a proportion of 1.8:0.4:2.0:(1.8 to 2.2):3.0:10.3 between the individual components. Small variations in the composition of the powder mixture in relation to the stoichiometric relationship in the superconducting high-$T_c$ phase to be formed should be possible in general, as long as an at least partial formation of the desired phase is ensured. Said powder mixture is then calcined, in the well-known manner, in two stages, by annealing it for 3 to 4 hours at approximately 800° C. and subsequently, for example, for 16 hours at approximately 820° C. The material thus obtained is then ground, for example, in a planetary ball mill. The product obtained is the "precursor" or "calcine" for the HTSL material and exhibits a plurality of completely different compounds of the HTSL material, for example, alkaline earth potassium plumbate $(Ca,Sr)_2PbO_4$, alkaline earth cuprates of different compositions $(Ca,Sr)_xCu_yO_{x+y}$, CaO, CuO, as well as perovskite $(Bi,Pb)_2Sr_2CuO_x$ (also known as 1-layer) and $(Bi,Pb)_2Sr_2CaCu_2O_y$ (also known as 2-layer).

The HTSL material precursor thus produced is subsequently introduced in a tubular carrier made of a special matrix material and is pre-compacted. Ag and Ag alloys are advantageously used as matrix materials, since these materials allow oxygen transport through diffusion mechanisms, in particular at high temperatures.

The structure thus obtained, consisting of the tubular carrier and the precursor material core contained in it, is subsequently subjected to a special forming operation to reduce the cross section and a special annealing operation to form the desired 2223 phase. In general, a sequence of a plurality of forming treatments are required to form the desired end shape of the conductor and a plurality of annealing operations are required to form the high-$T_c$ phase of the superconducting material, at least one of which must be carried out according to this invention. At least one forming treatment, for example, uniaxial pressing, can be performed between several annealing operations to achieve in particular better texturization of the superconducting material.

For the at least one forming operation, all known procedures, such as for example pressing, rolling, calendering, hammering, and drawing, can be considered, which can also be used in combination. This treatment can be performed both at room temperature and at higher temperatures. The pressure exerted on the core made of the treated precursor material is advantageously adjusted to between 3 and 20 kbar, preferably between 5 and 10 kbar. A high-density conductor core is thus obtained in an Ag matrix. After the at least one forming operation, a raw conductor in the form of a composite is obtained with a configuration at least largely corresponding to the desired end product, preferably in the form of a tape.

With the above-described process steps involving calcination to obtain a superconductor material precursor and forming of this precursor into a carrier tube made of the matrix material, not only single-core conductors can be manufactured. Rather, these process steps can also serve as a basis for manufacturing multi-core, or multifilamentary, conductors using a bundling method that is well-known per se. According to this method, a plurality of carrier tubes, each containing a core of calcined precursor material, can be bundled into a shell, in particular, a shell made of the matrix material. This structure is then formed at least once, which results in a multicore raw conductor. Of course, pre-formed and/or possibly pre-annealed single-core raw conductors can also be introduced in a suitable shell and then further processed into a multicore raw conductor using at least one forming operation.

One embodiment of such a multicore raw conductor obtained after a sequence of pressing and rolling operations to be processed into a tape-shaped superconductor according to the invention is illustrated in FIG. 1 of the drawing as a cross-section. The raw conductor is generally denoted with 2. Its (for example 19) conductor cores $3i$ (with $1 \leq i \leq 19$) made of the precursor material are embedded in a matrix 4 made of Ag. Raw conductor 2 has, for example, the following dimensions that are typical for a tape:

Tape thickness D: 100 $\mu$m to 500 $\mu$m preferably 200 $\mu$m to 350 $\mu$m;

Tape width B: 2 mm to 6 mm preferably 3.5 mm to 4.5 mm;

Conductor core thickness d: 10 $\mu$m to 50 $\mu$m preferably 20 $\mu$m to 35 $\mu$m;

Conductor core width b: 30 $\mu$m to 200 $\mu$m preferably 150 $\mu$m to 180 $\mu$m.

The corresponding typical dimensions for a tape-shaped single-core raw conductor are:

50 $\mu$m $\leq$ D $\leq$ 400 $\mu$m, preferably 100 $\mu$m $\leq$ D $\leq$ 200 $\mu$m;

1.5 mm $\leq$ B $\leq$ 5 mm, preferably 2 mm $\leq$ B $\leq$ 3 mm;

10 $\mu$m $\leq$ d $\leq$ 40 $\mu$m, preferably 20 $\mu$m $\leq$ d $\leq$ 30 $\mu$m 500 $\mu$m $\leq$ b $\leq$ 4.5 mm, preferably 1.5 mm $\leq$ b $\leq$ 2.5 mm A raw conductor, for example, with a structure as illustrated in FIG. 1 in general does not yet exhibit the desired superconducting properties. This means that the desired superconducting phase, in particular of the 2223 type, is not yet present in its at least one core with sufficient purity and a texture allowing for a high critical current density. Therefore, the raw conductor is subjected to at least one special annealing operation, with a periodically, oscillatina, non-isothermal temperature variation, according to the invention. The periodically oscillating temperature variation occurs between two extreme values of temperature in prescribed, regularly returning time intervals or periods. In every period, a maximum value and a minimum value of temperature are set one single time. Annealing is carried out in an oxygen-containing atmosphere, for example, in air or the like with the partial pressure of oxygen between 1 and 200 mbar.

Figure 2:
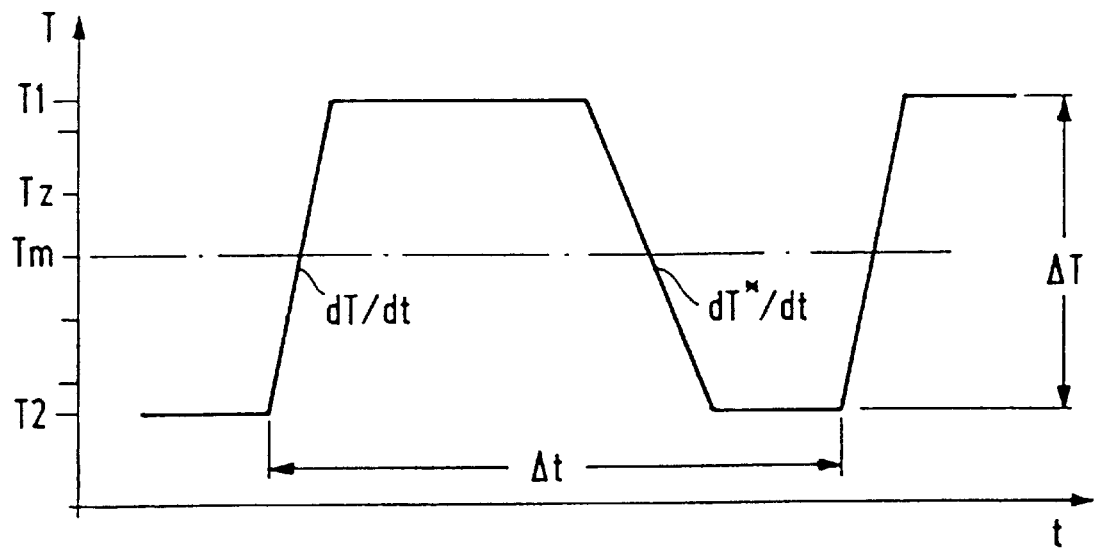
FIG. 2 is a graph which shows the temperature variation in an annealing process according to the present invention.

FIG. 2 schematically shows this temperature variation in a diagram, where the annealing temperature T (in 1° C. steps) is plotted against time t (in arbitrary units).

T1 is a first temperature at a higher temperature level,

T2 is a second temperature at a relatively lower temperature level, $\Delta T$ (=T1−T2) is the temperature difference (oscillation amplitude) between the two annealing temperatures T1 and T2, $\Delta t$ is the duration of an oscillation period, consisting of the times of the two annealing periods at temperature T1 and temperature T2, (dT/dt) is the average heating rate from temperature T2 to temperature T1, and (dT*/dt) is the average cooling rate from temperature T1 to temperature T2.

Temperature T1 is higher than the decomposition temperature Tz of the high-$T_c$ phase to be formed by so much that during the annealing periods at the higher temperature T1 a low-viscosity melt is obtained that can penetrate to all points of the texture between the individual phases and ensures the particle transport to these points that is required for the reaction. Accordingly, the superconducting phases of type 2212 and/or 2223 will melt or start to decompose at the higher temperature T1. In the following annealing period with the reduced temperature T2 (below Tz), the superconducting phases can then recover and grow in all directions, since they are wetted by the melt that is now highly viscous and no particle transport is needed over greater distances. The temperature variation must be selected so that over time more superconducting phase is produced during the periods with the lower annealing temperature T2 than is lost during the periods with the higher annealing temperature T1. The dwell times at the different temperature levels can be different. In addition, it must be ensured that the first annealing of the raw conductor starts with a period of lower annealing temperature as a "reaction annealing," because when the raw conductor is first heated to a high temperature, excessive melting of the precursor material would hinder the formation of texturized, lead-containing Bi-2212 crystals on the boundary surface with the Ag material of the matrix. These crystals are essential as seeds for the formation of a proper texture in the entire superconducting core. A 1-layer phase that may still be present quickly disappears during the first heating to a high temperature at the latest, namely at a temperature prior to reaching the melting point Tz for the first time.

The following non-isothermal temperature variation is provided for the reaction and recovery annealings according to the invention:

The first higher temperature T1 must be at most 7 K, in particular at most 5 K, more advantageously at most 3 K above the decomposition temperature Tz of the ceramic superconductor material in the matrix made of Ag material. The decomposition temperature Tz is, by definition, the temperature at which the formation of the Bi-2201 phase, not previously or no longer present can be detected, using X-ray diffractometry, in the ceramic core after quick cooling of the conductor end product (silver tape conductor). Depending on the partial pressure of oxygen and the conductor geometry, Tz is between approximately 800° C. and 880° C. The second, lower annealing temperature T2 must be at most 9 K, preferably at most 7 K, more preferably at most 5 K below the decomposition temperature Tz. In general, an average annealing temperature Tm=(T1)/2+(T2)/2 is selected between T2 and T1, which is 0.5 K to 3 K below the decomposition temperature Tz of the ceramic superconducting material.

The amplitude $\Delta T$ of the annealing temperature variation (oscillation) must be between 1 K and 10 K.

The duration of an oscillation period $\Delta t$ must be between 2 minutes and 200 minutes.

The temperature variation over time can advantageously be described by a sinus function or a trapeze function with heating and cooling rates (dT/dt) and dT*/dt) between 10 K/min and 0.01 K/min in a temperature-time diagram (see FIG. 2).

Figure 3:
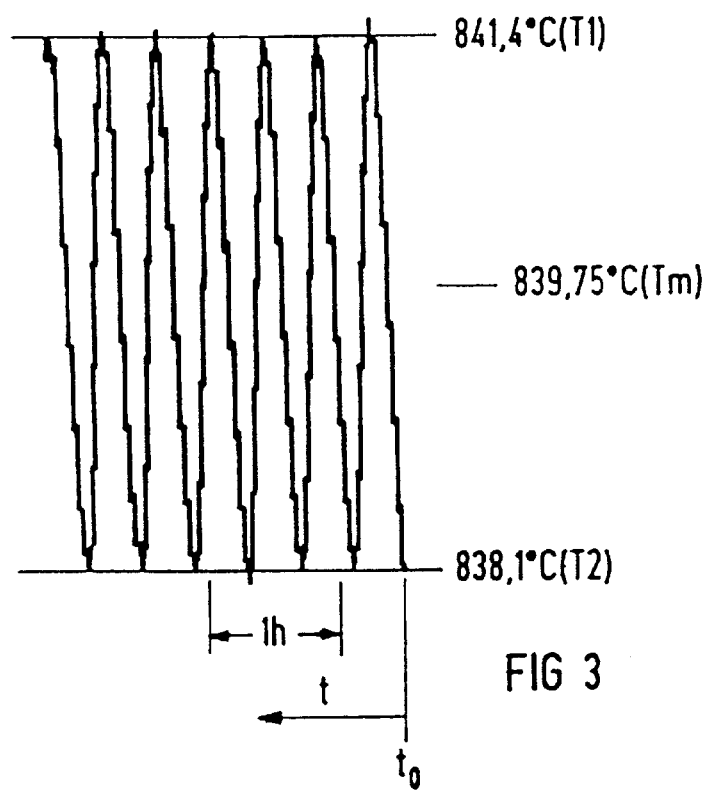
FIG. 3 is a graph which shows the temperature variation for a specific embodiment of the annealing process according to the present invention.

In a diagram similar to that of FIG. 2, FIG. 3 shows a temperature variation according to the invention for a specific embodiment of a single-core raw conductor, where the periodic temperature variation starts at time $t_o$ and temperature T2. A silver tube with 8 mm outer diameter and 1 mm wall thickness is used for manufacturing the raw conductor filled with a calcine having the nominal composition $Bi_{1.84}Pb_{0.35}Sr_{2.0}Ca_{2.1}Cu_{3.0}O_{10+x}$ and hammered to a diameter of 0.5 mm. After being inserted in a second silver tube with the same dimensions (8 mm O.D., 1 mm wall thickness), the assembly is hammered to a diameter of 1.5 mm, then drawn to a diameter of 1.3 mm, and finally rolled to a tape with 0.1 mm thickness. The raw conductor is then subjected to triple annealing in air in a tubular furnace, as illustrated in FIG. 3 and pressed uniaxially under a pressure of 10 kbar for compacting and texturizing after each annealing operation. The following parameters were used for the individual annealing operations:

T1=841.4° C., T2=838.1° C., Tm=839.75° C.

$\Delta T$=3.3 K (dT/dt)=(dT*/dt)=0.3 K/min $\Delta T$=22 min.

In this case the decomposition temperature was approximately 840° C. The suitably annealed end products had reproducibly critical current densities clearly higher than $4 \times 10^4$ A/cm$^2$ at zero field and 77 K.

For the above-described embodiments, it was assumed that the elongated, in particular tape-shaped, superconductors were to be annealed according to the invention in a powder-in-tube process. The invention is, however, not limited to such a process. It is equally well suited for manufacturing superconductors with a Bi-2212 phase or Bi-2223 phase having Ag shells assembled subsequently around a superconductor material precursor. An example of such an assembled shell is given in German Offenlegungsschrift 43 08 681. According to that publication, the precursor is to be applied in a paste form onto a tape-shaped Ag carrier. The surface portions of this precursor that remain free are then sealed using, for example, a foil-type covering means prior to processing the structure thus obtained into a raw conductor, which is to be subsequently annealed according to the invention.

The process according to the invention is also not limited to the manufacture of single- or multicore superconductors basically only with the Bi-2223 phase. Superconductors having only mainly Bi-2212 phase or a mixture of Bi-2212 and Bi-2223 phases can also be produced with this process. The aforementioned definition of the decomposition temperature Tz applies to those cases as well.

What is claimed is:

1. A process for producing an elongated single- or multicore superconductor with at least one conductor core embedded in a matrix consisting of Ag material that has a bismuth-containing superconductor material with a high-$T_c$ phase of 2212 and/or 2223 type, comprising the steps of:

preparing a structure of matrix material and at least one core made of a superconductor material precursor, converting said structure to a raw conductor, and subjecting the raw conductor to an annealing operation with controlled melting in an oxygen-containing atmosphere to form the high-$T_c$ phase, wherein at least one annealing operation is provided with a oscillating temperature variation, said oscillating temperature variation being performed in a plurality of time periods, in each of said time periods the temperature varying between a first, higher temperature level (T1) and a second, lower temperature level (T2), with the first temperature level being at most 7 K above the decomposition temperature (Tz) of the high-$T_c$ phase to be formed and the second temperature level (T2) being at most 9 K below the decomposition temperature (Tz), wherein a temperature difference ($\Delta T$) of between 1 and 10 K between the higher and the lower temperatures T1 and T2 is provided.

2. The process according to claim 1, wherein a higher temperature (T1) of at most 5 K above the decomposition temperature (Tz) of the high-$T_c$ phase is provided.

3. The process according to claim 1, wherein a lower temperature (T2) of at most 7 K below the decomposition temperature (Tz) of the high-$T_c$ phase is provided.

4. The process according to claim 1, wherein an oscillation period of between 2 minutes and 200 minutes is provided.

5. The process according to claim 1, wherein an average heating rate (dT/dt) from the lower temperature T2 to the higher temperature T1 and an average cooling rate (dT*/dt) from the higher temperature (T1) to the lower temperature (T2) of between 0.01 K/min and 10 K/min are provided.

6. The process according to claim 1, wherein the raw conductor is annealed to form the high-$T_c$ phase at a partial pressure of oxygen of between 1 mbar and 200 mbar.

7. The process according to claim 1, wherein to produce the precursor material, at least one of the metallic components of the aforementioned type of high-$T_c$ phase is substituted with at least one other metallic component.

8. The process according to claim 1, wherein the structure is produced from the matrix material and the at least one core made of the precursor material by the powder-in-tube process.

9. The process according to claim 1, wherein a plurality of annealing operations are provided, between which the conductor is subjected to a uniaxial pressing treatment.

10. The process according to claim 1, wherein said step of converting further comprises using a cross-section-reducing forming operation.

11. The process according to claim 2, wherein a higher temperature (T1) of at most 3 K above the decomposition temperature (Tz) of the high-$T_c$ phase is provided.

12. The process according to claim 3, wherein a lower temperature (T2) of at most 5 K below the decomposition temperature (Tz) of the high-$T_c$ phase is provided.

13. The process according to claim 7, wherein the Bi component is partially substituted with Pb and/or a stoichiometry that is different from the basic composition of the high-$T_c$ phase is provided, as long as at least a partial formation of the high-$T_c$ phase is ensured.

* * * * *